United States Patent
Matsuzawa (10) Patent No.: US 7,777,510 B2
(45) Date of Patent: Aug. 17, 2010

(54) WAFER INSPECTING APPARATUS, WAFER INSPECTING METHOD AND COMPUTER PROGRAM

(75) Inventor: Takahito Matsuzawa, Hokkaido (JP)

(73) Assignee: Tokyo Electron Limited (JP)

( * ) Notice: Subject to any disclaimer, the term of this patent is extended or adjusted under 35 U.S.C. 154(b) by 152 days.

(21) Appl. No.: 12/065,621

(22) PCT Filed: Sep. 21, 2006

(86) PCT No.: PCT/JP2006/318718

§ 371 (c)(1),
(2), (4) Date: Mar. 4, 2008

(87) PCT Pub. No.: WO2007/034863

PCT Pub. Date: Mar. 29, 2007

(65) Prior Publication Data

US 2009/0128178 A1    May 21, 2009

(30) Foreign Application Priority Data

Sep. 22, 2005   (JP)   .............................. 2005-275150

(51) Int. Cl.
*G01R 31/02* (2006.01)
(52) U.S. Cl. ....................... 324/758; 324/760
(58) Field of Classification Search .............. 324/158.1, 324/754–765
See application file for complete search history.

(56) References Cited

U.S. PATENT DOCUMENTS 5,644,245 A * 7/1997 Saitoh et al. ................. 324/754
6,111,421 A   8/2000 Takahashi et al.

(Continued)

FOREIGN PATENT DOCUMENTS

JP    1-270243    10/1989

(Continued)

OTHER PUBLICATIONS

Korean Office Action dated May 26, 2009.

*Primary Examiner*—Ha Tran T Nguyen
*Assistant Examiner*—Joshua Benitez
(74) *Attorney, Agent, or Firm*—Finnegan, Henderson, Farabow, Garrett & Dunner, L.L.P.

(57) ABSTRACT

There is provided a wafer inspecting apparatus which reduces a preheating time of a probe, and prevents the probe and a wafer from being damaged. The apparatus has a stage (10) which allows a semiconductor wafer (W) to be mounted on a top face thereof and heats or cools it, a drive mechanism (11) which drives the stage up and down, a probe card (9) disposed upward the stage, and having a probe needle (9A) that contacts a bonding pad of the semiconductor wafer to transmit a signal, a position control device (2) which controls the drive mechanism in such a way that the bonding pad of the semiconductor wafer contacts the probe needle of the probe card, and clock means (28) for measuring an elapsed time after the probe needle is caused to contact the bonding pad, and the position control device controls the position of the drive mechanism by adding a position correction value in such a way that the bonding pad contacts the probe needle with a predetermined distortion amount based on a predetermined temperature at which the semiconductor wafer is inspected, and the elapsed time after the probe needle is caused to contact the bonding pad.

15 Claims, 6 Drawing Sheets

U.S. PATENT DOCUMENTS

| | | | |
|---|---|---|---|
| 6,498,504 B2 * | 12/2002 | Miyagi | 324/754 |
| 6,593,761 B1 * | 7/2003 | Fukasawa et al. | 324/754 |
| 7,271,604 B2 * | 9/2007 | Reitinger | 324/760 |
| 7,477,064 B2 * | 1/2009 | Kurihara et al. | 324/758 |
| 2007/0164770 A1 * | 7/2007 | Casler et al. | 324/765 |
| 2007/0262782 A1 * | 11/2007 | Hartmann | 324/754 |

FOREIGN PATENT DOCUMENTS

| | | |
|---|---|---|
| JP | 11-150164 | 6/1999 |
| JP | 11-176893 | 7/1999 |
| JP | 2000-299360 | 10/2000 |
| JP | 2003-273175 | 9/2003 |
| JP | 2004-253716 | 9/2004 |
| JP | 2005-333045 | 12/2005 |
| JP | 2006-173206 | 6/2006 |
| KR | 1999-37193 | 5/1999 |

* cited by examiner

WAFER INSPECTING APPARATUS, WAFER INSPECTING METHOD AND COMPUTER PROGRAM

TECHNICAL FIELD

The present invention relates to an inspecting apparatus, an inspecting method and a computer program which measure an electrical characteristic of multiple IC chips formed on a semiconductor wafer.

BACKGROUND ART

Inspecting apparatus which measure an electrical characteristic of multiple IC chip (hereinafter, devices) formed on a semiconductor wafer (hereinafter, simply called wafer) have, for example, a loader unit and a prober unit. The loader unit carries a wafer. The prober unit measures the electrical characteristic of each device on the wafer delivered from the loader unit The loader unit is provided with a cassette mounting unit, a pincette, and a sub-chuck. The cassette mounting unit allows wafers to be mounted thereon cassette by cassette. The pincette carries a wafer to the loader unit. The sub-chuck performs pre alignment to align the direction of a wafer based on its ori-fla (orientation flat) while the wafer is held and carried by the pincette. The prober unit is provided with a main chuck (stage), an alignment mechanism and a probe card The main chuck receives a wafer which has undergone pre-alignment from the pincette, and mounts it thereon. The main chuck is movable in X, Y, Z and θ directions. The alignment mechanism precisely positions a wafer on the main chuck. The probe card has a probe needle which contacts an electrode pad on the wafer in such a manner as to be electrically conducted therewith after positioning.

The tester of a wafer inspecting apparatus has a test head. The test head is electrically connected with the probe card attached to the head plate of the prober unit. The test head mediates transmission/reception of a signal between the tester and the probe card. Inspection for the electrical characteristic of a device formed on a wafer is carried out by transmitting/receiving a signal between the probe card and the tester.

In a case where wafer inspection is carried out at a high temperature or a low temperature, the probe itself expands and contracts by the temperature, so that it is necessary to heat (preheat) or cool the probe before the inspection is started.

When preheating is performed with the probe being brought closer to (but does not come in contact with) a heat source (chuck), several minutes to several ten minutes are required to cause the probe to be at a target temperature. When preheating is performed with the probe contacting a wafer, which is an inspection target on the chuck, the required time can be reduced, but there is a large possibility that the probe or the wafer is damaged due to thermal deformation of the probe card and expansion and contraction of the probe.

There is proposed a technique which substantially stabilizes the relative position of the stage to the probe card from the beginning to the end of a temperature test in accordance with expansion and contraction of the probe needle. For example, Japanese Patent Application KOKAI Publication No. H11-176893 (hereinafter, Patent Literature 1) discloses a method of detecting at least either one of the temperature of the probe card and pressure that the probe card contacts a connection member, and of connecting the position of the heating stage based on the obtained value.

According to the technique disclosed in Patent Literature 1, however, it is necessary to dispose a temperature sensor or a pressure sensor on the probe card or therearound to detect a temperature or pressure. Thus, the structure around the probe card becomes complex, and the cost of the wafer inspecting apparatus increases, and it requires a lot of maintenance time.

Japanese Patent Application KOKAI Publication No. 2000-299360 (hereinafter, Patent Literature 2) discloses a technology which employs heating/cooling means for heating/cooling a wafer and a wafer-probe-pin module with separate individual temperature control systems. This technology is a technology which detects a difference in thermal expansion amounts between a wafer and a wafer-pin module by a differential transmission or the like, and performs negative feedback control on the heating/cooling means for the wafer-probe-pin module in such a way that the difference becomes eliminated to make the thermal expansion amount uniform.

According to the technology disclosed in Patent Literature 2, however, independent heating/cooling means is required for the probe card in addition to heating/cooling means for a wafer. Therefore, the wafer inspecting apparatus becomes complex, and the cost thereof increases, and it requires a lot of maintenance time.

DISCLOSURE OF THE INVENTION

Problem to be Solved by the Invention

The present invention has been made to overcome the foregoing problems, and it is an object of the invention to provide a wafer inspecting apparatus which maintains the contact of a probe with an inspection object in a normal condition without a pressure sensor and independent heating/cooling means when wafer inspection is carried out at a high temperature or a low temperature.

Moreover, another object of the invention is to provide a wafer inspecting apparatus which reduces the preheat time of a probe, and prevents the probe and a wafer from being damaged.

Means for Solving the Problem

A wafer inspecting apparatus according to the first aspect of the invention comprises: a stage provided with a heater or a cooler thereinside, allowing a semiconductor wafer to be mounted on a top face thereof, and heating or cooling the semiconductor wafer to a predetermined temperature; a drive mechanism driving the stage up and down; a probe card disposed upward the stage, and having a probe needle which comes in contact with a bonding pad formed on the semiconductor wafer to transmit a signal; a position control device controlling the drive mechanism in a manner causing a bonding pad of the semiconductor wafer to contact the probe needle of the probe card; and a clock means for measuring an elapsed time after the probe needle is caused to contact the bonding pad, and wherein the position control device controls a position of the stage by adding a position correction value based on the predetermined temperature and the elapsed time measured by the clock means after the probe needle is caused to contact the bonding pad, thereby causing the bonding pad of the semiconductor wafer to contact the probe needle of the probe card with a predetermined distortion amount.

Preferably, the wafer inspecting apparatus comprises a probe change memory means for storing a result of preliminary measurement of a relationship between an elapsed time after the probe needle is caused to contact a bonding pad of the semiconductor wafer mounted on the stage and heated or cooled to a predetermined temperature and an amount of expansion and contraction of the probe needle, and wherein the position control device controls a position of the stage by adding a position correction value based on the predetermined temperature, the elapsed time measured by the clock means after the probe needle is caused to contact the bonding pad, and the relationship stored in the probe change memory means between the elapsed time and the expansion and contraction amount of the probe needle, thereby causing the bonding pad of the semiconductor wafer to contact the probe needle of the probe card with a predetermined distortion amount.

Preferably, the probe change memory means may store individual elapsed time points at which an elapsed time after the probe needle is caused to contact the bonding pad is divided at predetermined intervals, and store expansion and contraction amount of the probe needle associated with each elapsed time point) and a length of the interval may be defined in a manner causing expansion and contraction amounts of the probe needle at individual intervals to be greater than or equal to a resolution of the control of the drive mechanism by the position control device based on the result of preliminary measurement of the relationship between the elapsed time after the probe needle is caused to contact a bonding pad and an expansion and contraction amount of the probe needle.

In this mode, further, the elapsed time after the probe needle is caused to contact a bonding pad may be a finite time, and a length of the interval at a beginning of the finite time may be shorter than a length of the interval at an end of the finite time.

In this mode, further, a length of the interval gradually may become larger from a beginning to an end of the finite time.

Preferably, the position control device corrects the relationship between the elapsed time stored in the probe change memory means and an expansion and contraction amount of the probe needle based on a temperature around the probe needle and the semiconductor wafer.

Preferably, the wafer inspecting apparatus comprises: temperature memory means for storing a temperature when the semiconductor wafer is subjected to inspection; after-separation clock means for measuring an elapsed time from after one inspection is finished and the probe needle is separated away from a bonding pad of the semiconductor wafer to a current time; and expansion-and-contraction-amount estimation means for estimating an expansion and contraction amount of the probe needle based on a temperature at a previous inspection stored in the temperature memory means, and the elapsed time measured by the after-separation clock means from after the previous inspection is finished and the probe needle is separated away from a bonding pad of the semiconductor wafer to a current time, and wherein the position control device controls a position of the stage by adding a position correction value in a manner causing a bonding pad of the semiconductor wafer to contact the probe needle of the probe card with a predetermined distortion amount based on an expansion and contraction amount of the probe needle estimated by the expansion-and-contraction-amount estimation means, and the predetermined temperature, and the elapsed time measured by the clock means after the probe needle is caused to contact the bonding pad.

A wafer inspecting method according to the second aspect of the invention causes a probe needle for transmitting a signal to contact a bonding pad on a semiconductor wafer mounted on a stage to measure an electrical characteristic of a device formed on the semiconductor wafer, and comprises: a heating or cooling step of heating or cooling the semiconductor wafer to a predetermined temperature; a clock step of measuring an elapsed time after the probe needle is caused to contact a bonding pad on the semiconductor wafer heated or cooled to the predetermined temperature; and a stage-position correction step of controlling a position of the stage by adding a position correction value based on the predetermined temperature and the elapsed time measured by the clock step, thereby causing the bonding pad to contact the probe needle with a predetermined distortion amount.

Preferably, the wafer inspecting method further comprises a probe-change actual measurement step of pre-measuring a relationship between an elapsed time after the probe needle is caused to contact the semiconductor wafer mounted on the stage and heated or cooled to a predetermined temperature and an amount of expansion and contraction of the probe needle, and wherein in the stage-position correction step, the position of the stage is controlled by adding a position correction value based on the predetermined temperature, the elapsed time measured by the clock step, and the relationship between the elapsed time obtained in the probe-change actual measurement step and an expansion and contraction amount of the probe needle, thereby causing a bonding pad of the semiconductor wafer to contact the probe needle with a predetermined distortion amount.

Preferably, in the probe-change actual measurement step, individual elapsed time points at which an elapsed time after the probe needle is caused to contact the bonding pad is divided by predetermined intervals may be measured, and an expansion and contraction amount of the probe needle corresponding to each elapsed time point may be measured, and a length of the interval may be defined in a manner causing expansion and contraction amounts of the probe needle at individual intervals to be greater than or equal to a resolution of the control of the drive mechanism by the position control device based on a result of preliminary measurement of the relationship between the elapsed time after the probe needle is caused to contact a bonding pad and an expansion and contraction amount of the probe needle.

In this mode, further, the elapsed time after the probe needle is caused to contact a bonding pad may be a finite time, and a length of the interval at a beginning of the finite time may be shorter than a length of the interval at an end of the finite time.

In this mode, further, a length of the interval gradually may become larger from a beginning to an end of the finite time.

Preferably, the wafer inspecting method further comprises a correction step of correcting the relationship stored in probe change memory means between the elapsed time and an expansion and contraction amount of the probe needle based on a temperature around the probe needle and the semiconductor wafer, prior to the stage-position correction step.

Preferably, the wafer inspecting method further comprises: a temperature storing step of storing a temperature when a semiconductor wafer is subjected to inspection; an after-separation clock step of measuring an elapsed time after one inspection is finished and the probe needle is separated away from a bonding pad of the semiconductor wafer to a current time; and an expansion-and-contraction-amount estimation step of estimating an expansion and contraction amount of the probe needle based on a temperature at a previous inspection stored in the temperature storing step, and an elapsed time measured in the after-separation clock step from after the previous inspection is finished and the probe needle is separated away from a bonding pad of the semiconductor wafer to a current time, and wherein in the stage-position correction step, the position of the stage is controlled by adding a position correction value in a manner causing a bonding pad of the semiconductor wafer to contact the probe needle of the probe card with a predetermined distortion amount based on an expansion and contraction amount of the probe needle estimated in the expansion-and-contraction-amount estimation step, and a predetermined temperature at which the semiconductor wafer is heated or cooled, and an elapsed time measured in the clock step after the probe needle is caused to contact the bonding pad.

A computer program according to the third aspect of the invention allows a computer to control a wafer inspecting apparatus which comprises: a stage provided with a heater or a cooler inside thereof, allowing a semiconductor wafer to be mounted on a top face thereof, and heating or cooling the semiconductor wafer to a predetermined temperature; a drive mechanism driving the stage up and down; a probe card disposed upward the stage, and having a probe needle that contacts a bonding pad formed on the semiconductor wafer to transmit a signal; a position control device controlling the drive mechanism in a manner causing a bonding pad of the semiconductor wafer to contact the probe needle of the probe card; and clock means for measuring an elapsed time after the probe needle is caused to contact the bonding pad, and allows the clock means to execute a clock process of measuring an elapsed time after the probe needle is caused to contact the bonding pad, and the position control device to execute a stage-position correction process of controlling a position of the stage by adding a position correction value in a manner causing a bonding pad of the semiconductor wafer to contact the probe needle of the probe card with a predetermined distortion amount based on the predetermined temperature and an elapsed time measured in the clock step after the probe needle is caused to contact the bonding pad.

Effects of the Invention

The wafer inspecting apparatus of the invention does not require temperature or pressure sensors and the like, and can maintain the contact of the probe with an inspection object in a normal condition with the same hardware (H/W) structure as conventional ones without additional H/W costs.

What is more, the preheat time can be reduced to several fractions to several tenth of the preheat time needed in a method of performing preheat on a probe without causing the probe to contact a heat source.

DESCRIPTION OF REFERENCE NUMBERS

1 Wafer inspecting apparatus
2 Position control device
3 Loader unit
4 Prober unit
5 Tester
6 Display device
7 Test head
8 Head plate
9 Probe card
9A Probe needle
10 Main chuck (stage)
11 Drive mechanism
12 Alignment mechanism
13 Heating/cooling device
20 Internal bus
21 Controller
22 Main memory unit
23 External memory unit
24 Input unit
25 Display unit
26 Transmission/reception unit
27 Output unit
28 Clock unit

BEST MODE FOR CARRYING OUT THE INVENTION

An explanation will be given of the embodiments of the invention in detail with reference to the drawings. Note that the same or corresponding parts in the figures will be denoted by the same reference numerals.

First Embodiment

Figure 1:
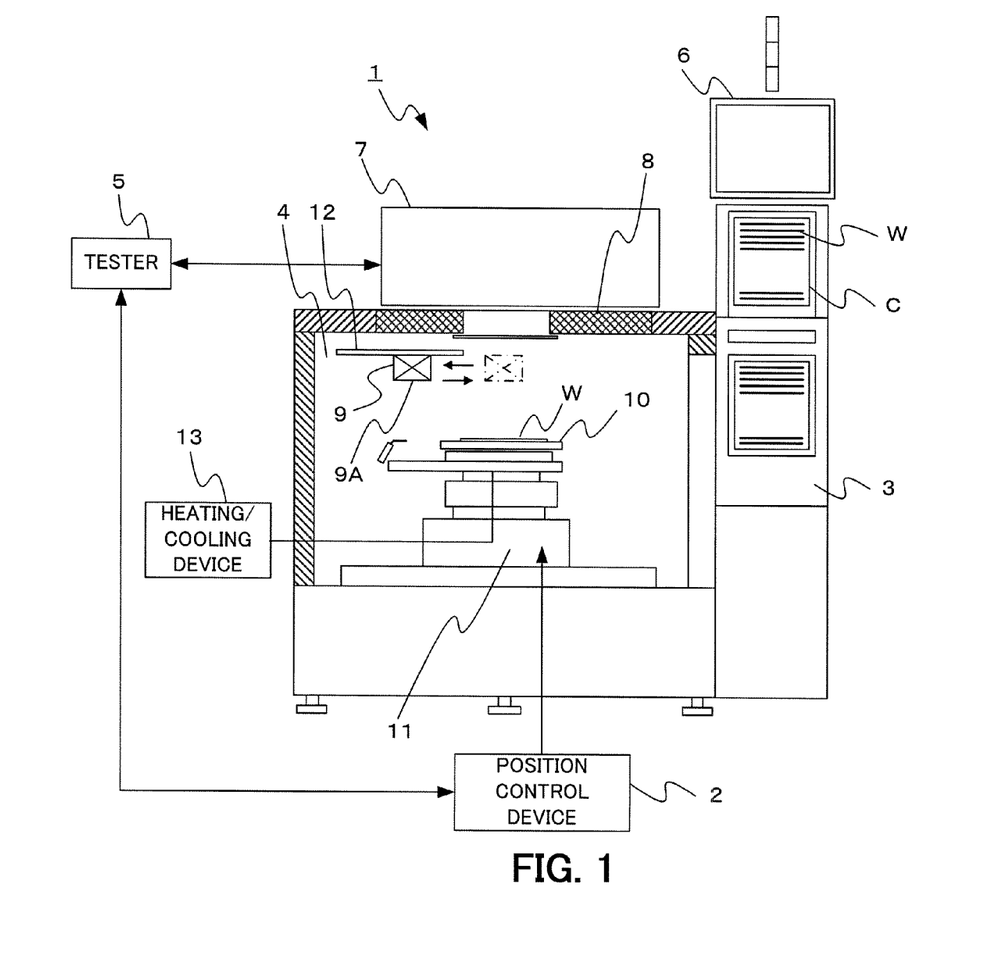
[FIG. 1] A structural diagram of a wafer inspecting apparatus according to an embodiment of the invention.

As shown in FIG. 1, a wafer inspecting apparatus according to the embodiment of the invention has a loader unit 3, a prober unit 4, a position control device 2, a display device 6 and a tester 5. The loader unit 3 carries a wafer W housed in a cassette C. The prober unit 4 measures the electrical characteristic of the wafer W carried by the loader unit 3. The position control device 2 drives and controls the loader unit 3 and the prober unit 4, respectively. The display device 6 serves as an operation panel for operating the position control device 2. The tester 5 has a test head 7. The test head 7 is electrically connected to a probe card 9 attached to a head plate 8 of the prober unit 4 in inspection, and is structured in such a manner as to be retraced from the prober unit 4 in maintenance or the like.

The loader unit 3 is provided with a sub-chuck (not shown) which performs pre-alignment on the wafer W with reference to the ori-fla (orientation flat) thereof. The wafer W is subjected to pre-alignment by the sub-chuck when the wafer W is carried from the loader unit 3 to the prober unit 4.

The prober unit 4 has a main chuck 10 and a drive mechanism 11. The main chuck 10 serves as a stage which performs vacuum absorption on the wafer W to allow it to be mounted thereon. The drive mechanism 11 moves the main chuck 10 in two directions X and Y orthogonal to each other in a horizontal plane, and in a height direction Z, and in a θ direction which represents rotation in the horizontal plane. The prober unit 4 further has an alignment mechanism 12, and the alignment mechanism 12 aligns a probe needle 9A of the probe card 9 to the wafer W on the main chuck 10. Respective electrode pads of devices on the wafer W on the main chuck 10 and a plurality of probe needles 9A of the probe card 9 are positioned with each other by the drive mechanism 11 and the alignment mechanism 12, and the electrode pads and the probe needles 9A are electrically interconnected to each other. The wafer inspecting apparatus 1 further has a heating/cooling device 13 for heating or cooling the main chuck 10.

For example, the main chuck 10 has a cooling device 13 and a Peltier device (not shown). In a case where a low temperature test is carried out, the Peltier device cools a tabular chuck top of the main chuck 10, and the cooling device 13 cools the bottom surface side of the main chuck 10. In a case where a high temperature test is carried out for example, a current is caused to flow through the Peltier device in a direction opposite to the cooling case to heat the chuck top.

Figure 2:
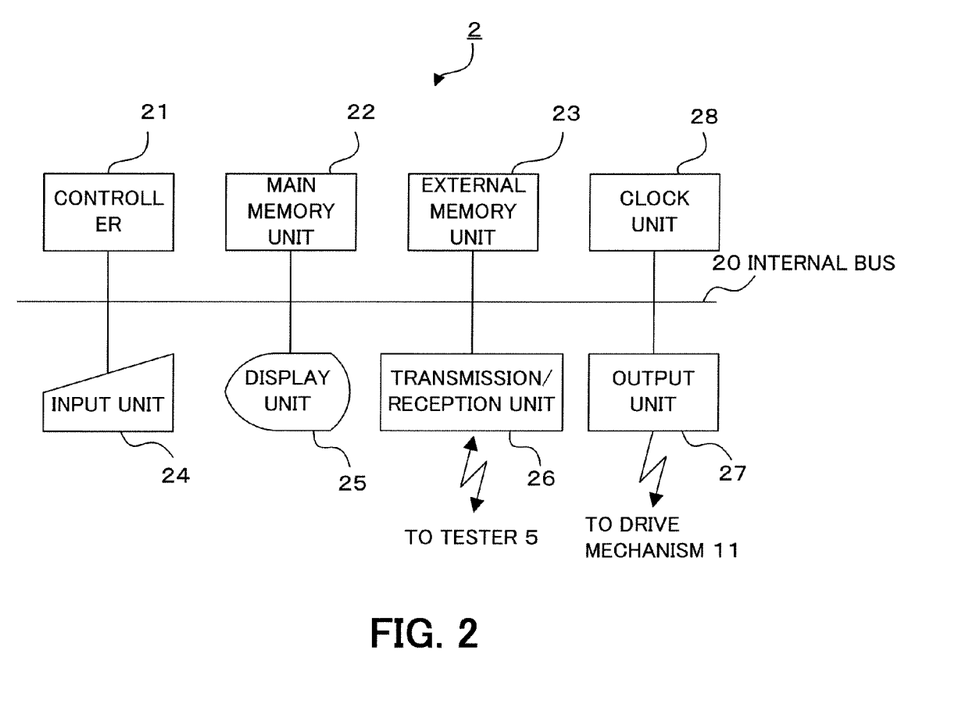
[FIG. 2] A block diagram of a position control device according to an embodiment of the invention.

As shown in FIG. 2, the position control device 2 comprises a controller 21, a main memory unit 22, an external memory unit 23, an input unit 24, a display unit 25, a transmission/reception unit 26, an output unit 27 and a clock unit 28. The main memory unit 22, the external memory unit 23, the input unit 24, the display unit 25, the transmission reception unit 26, the output unit 27 and the clock unit 28 are all connected to the controller 21 through an internal bus 20.

The controller 21 comprises a CPU (Central Processing Unit) or the like, monitors the state of the position control device 2 in accordance with a program stored in the external memory unit 23, executes a process corresponding to input through the input unit 24, and as a result of the process, displays input information, the control state of a drive unit and the like on the display unit 25.

The main memory unit 22 comprises a RAM (Random-Access Memory) or the like, and is used as a work area for the controller 21.

The external memory unit 23 comprises a non-volatile memory, such as a flash memory, a hard disk, a DVD (Digital Versatile Disc), a DVD-RAM (Digital Versatile Disc Random-Access Memory), or a DVD-RW (Digital Versatile Disc Rewritable). The external memory unit 23 pre-stores a program for allowing the controller 21 to execute the foregoing process. The external memory unit 23 supplies data to be used with the foregoing program and other programs to the controller 21 in accordance with instructions from the controller 21, and stores data supplied from the controller 21. The external memory unit 23 stores, for example, a relationship between an elapsed time to be discussed later and measured beforehand and a probe-needle leading end position displacement.

The input unit 24 comprises a keyboard or a key switch, a pointing device like a mouse, and an interface device which connects the keyboard, the pointing device or the like to the internal bus 20. Parameters or the like for controlling the drive mechanism 11 are input through the input unit 24, and are supplied to the controller 21.

The display unit 25 comprises a CRT (Cathode Ray Tube) or an LCD (Liquid Crystal Display). The display unit 25 displays input parameters for controlling the drive mechanism 11, the status of control for the drive mechanism 11, e.g., the current position coordinate of the stage, and the like.

The transmission/reception unit 26 comprises a modem or a serial interface or a LAN (Local Area Network) interface to be connected to a network terminator or the like. The controller 21 transmits necessary information to the tester 5 shown in FIG. 1 through the transmission/reception unit 26, and receives result information from the tester 5. For example, information to the effect that starting inspection becomes ready is transmitted to the tester 5, and information on the end of the inspection is transmitted from the tester 5.

The output unit 27 comprises a serial interface or a parallel interface. It may include a printer and a printer interface in some cases. The output unit 27 outputs control identifying value to the drive mechanism 11 in accordance with an instruction from the controller 21. When the drive mechanism 11 performs feedback control the output unit 27 inputs feedback information, such as the position of the main chuck 10 and the speed thereof, from the drive mechanism 11.

The clock unit 28 has, for example, a crystal oscillator, and a counter which counts a clock pulse oscillated by the crystal oscillator. The clock unit 28 is a timer for an arbitrary time which operates in accordance with an instruction from the controller 21. It also supplies a current time to the controller 21. For example, the controller 21 sets the counter of the clock unit 28 to some values. The clock unit 28 subtracts 1 from the counter for each clock pulse generation, and when the counter value becomes 0, an interruption signal to the controller 21 is generated. This allows the controller 21 to measure a certain time. Moreover, the controller 21 reads out the count number of a clock pulse from a reference time recorded in the clock unit 28 to come to know a proceeding time from the reference time, i.e., a current time.

Figure 3:
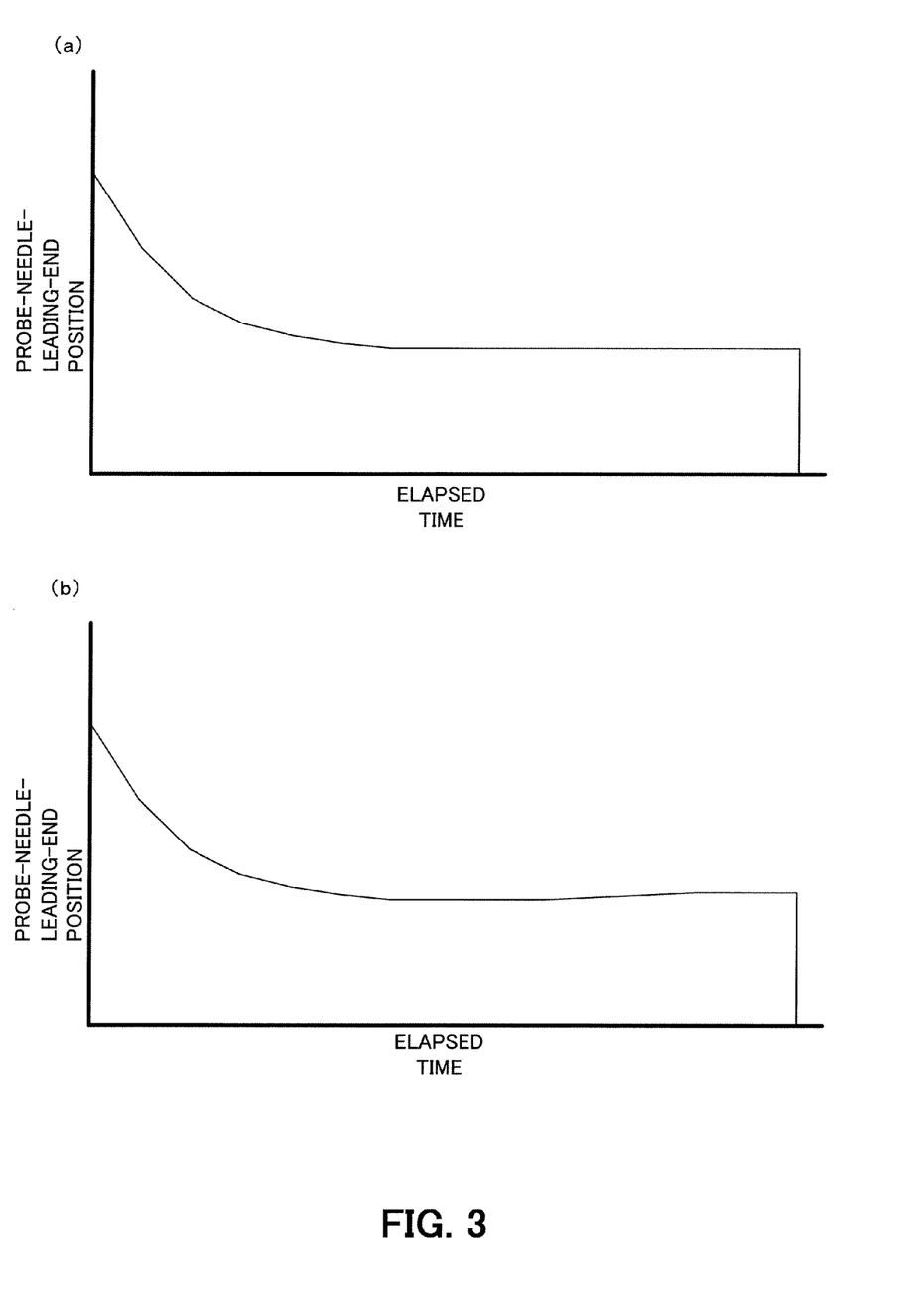
[FIG. 3] A diagram showing an example of the relationship between an elapsed time and the displacement of the leading end position of a probe needle according to the first embodiment of the invention.

FIG. 3 is a graph showing a relationship between an elapsed time after the probe needle 9A is caused to contact a bonding pad of a wafer W when the wafer W is held at, for example, a high temperature and the displacement of the leading end position of the probe needle 9A. FIG. 3(a) shows the displacement of the leading end position of the probe needle 9A which is logically estimated from the thermal conductivities and thermal expansion coefficients of the probe card 9 and probe needle 9A. FIG. 3(b) is a graph showing an example of a result that the leading end position of the probe needle 9A was actually measured with the probe needle 9A being caused to contact a wafer W held at some temperature in the wafer inspecting apparatus 1. To actually measure the displacement of the leading end position of the probe needle 9A, the probe needle 9A is cause to contact a bonding pad and to be slightly moved away per a certain time, and image measurement is performed on the leading end using a camera or the like.

In FIG. 3(b), the leading end position of the probe needle 9A once expands and then contracts slightly. It is thought that after the probe needle 9A expands, the probe card 9 is heated later and deforms, thereby causing the expansion and contraction. Briefly speaking in FIG. 3(a), as the height of the drive mechanism 11 is controlled based on the relationship acquired analytically between an elapsed time and the leading end position of the probe needle 9A, it becomes possible to cause the probe needle 9A to contact a wafer W with approximately uniform pressure. To be more precise, it is desirable that the height of the main chuck 10 (stage) should be controlled based on accrual measurement data shown in, for example, FIG. 3(b).

The relationship between the elapsed time and the leading end position of the probe needle shown in FIG. 3 is stored in the external memory unit 23 as a sequence of values of positions (distances from a reference point) of the probe needle 9A at individual certain times until the leading end position of the probe needle 9A is sufficiently stabilized after the probe needle 9A contacts a wafer. The expansion and contraction amount of the probe needle 9A is large at the beginning when the probe needle 9A is caused to contact a wafer W, so that the time interval at the beginning may be short and the time interval may become gradually long. In this case, the relationship between an elapsed time and the displacement of the leading end position of the probe needle is stored as data taking a time interval paired with a position.

To electrically conduct the probe card 9 with a wafer W, the drive mechanism 11 is subjected to overdrive control in such a way that the probe needle 9A has a certain distortion with respect to the leading end position of the probe needle 9A shown in FIG. 3 so that the probe needle 9A contacts a bonding pad of a wafer W with a constant strain. The overdrive amount is, for example, 10 μm.

Figure 4:
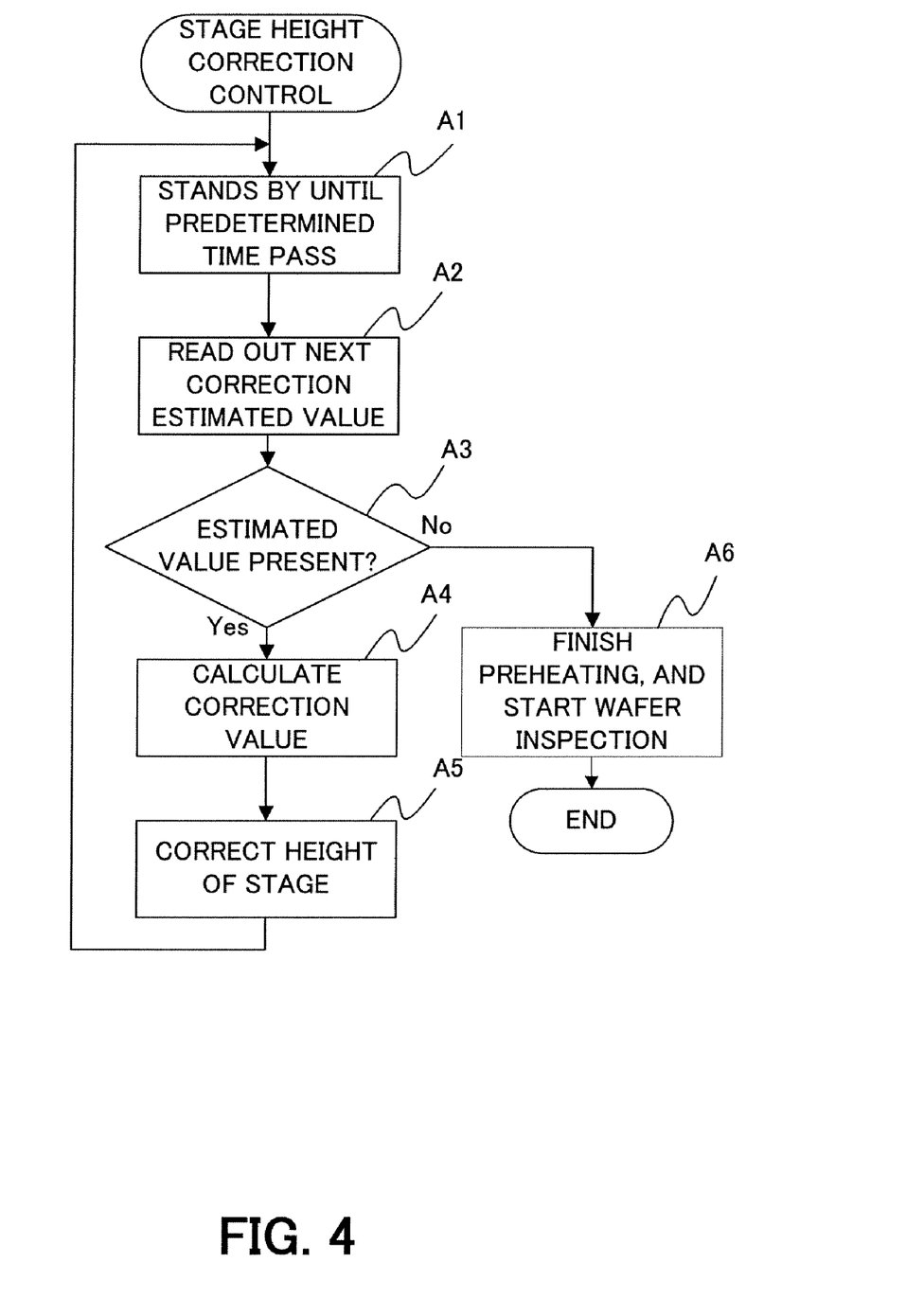
[FIG. 4] A flowchart showing an example of control operation for performing preheating in a wafer inspecting apparatus according to the first embodiment of the invention.

Next, an explanation will be given of the operation of the wafer inspecting apparatus 1 according to the first embodiment FIG. 4 is a flowchart showing an example of the control operation for the main chuck 10 (stage) for preheating the probe needle 9A and the probe card 9 in the wafer inspecting apparatus 1 of the first embodiment. A wafer is held at a temperature at which inspection is carried out, the drive mechanism 11 and the alignment mechanism 12 are controlled to cause the probe needle 9A to contact a bonding pad of a wafer W, and then a preheat operation is started.

First, the controller 21 sets the counter of the clock unit 28 to a predetermined value, and stands by until a certain time passes (step A1). This certain time is a time interval between adjoining values in the sequence of the values of the positions of the probe needle 9A based on the foregoing relationship between an elapsed time and the leading end position of the probe needle. The certain time is defined in such a way that the expansion of the probe needle 9A becomes greater than or equal to the resolution of the control by the drive mechanism 11 without damaging the probe needle 9A or a wafer W For example, the certain time is set to 10 seconds. As mentioned above, the time interval may be short at the beginning, and then may become gradually long. In this case, the controller 21 reads out the value of a next time interval from the external memory unit 23, and sets the counter of the clock unit 28 to the read-out value. This enables practical control. Note that regarding the detail of the scheme of defining the time intervals, let us indicate the respective lengths of the time intervals by, for example, $t(1), t(2), \ldots,$ and $t(n)$ (where n is a positive integer), then it may be defined as $t(1)<t(2)<\ldots<t(n)$, $t(1)\leq t(2)\leq \ldots \leq t(n)$, or $t(1)<t(2)<\ldots<t(n-m)=\ldots=t(n-1)=t(n)$ (where m is a positive integer and m<n).

Next, the controller 21 reads out a next value (correction estimated value) from the relationship (e.g., relationship shown in FIG. 3(b)) between an elapsed time and the leading end position of the probe needle stored in the external memory unit 23 (step A2). When a correction estimated value is present (step A3: Yes), a value for correcting the height of the main chuck 10 (stage) is calculated (step A4). The read-out correction estimated value represents a distance from a reference point, and is converted into the height of the main chuck 10, and an overdrive amount is added, and then the control amount by the drive mechanism 11 is acquired. The controller 21 instructs the control amount to the drive mechanism 11, thereby correcting the height of the main chuck 10 (stage) (step A5). Thereafter the process returns to the step A1 where the controller stands by until a certain time passes.

The operation from the step A1 to the step A5 is repeated until there becomes no correction estimated value for the relationship between an elapsed time and the leading end position of the probe needle. Absence of the correction estimated value means that the leading end position of the probe needle 9A is fully stabilized. Therefore, when there becomes no correction estimated value (step A3: Yes), the controller 21 notifies the tester 5 through the transmission/reception unit 26 that preheating is finished, and starts wafer inspection (step A6).

In this manner, it is possible to preheat the probe needle 9A and the probe card 9 with the probe needle 9A being caused to contact a bonding pad of a wafer W without damaging the probe needle 9A and the wafer W This results in reduction of the preheat time to several fractions to several tenths of that needed in a method of preheating the probe without causing the probe needle 9A and the probe card 9 to contact the wafer W.

Note that a case where a wafer W is heated is explained in the first embodiment, a cooling time of the probe needle 9A and the probe card 9 can be likewise reduced in case of cooling the wafer W. In this case, the displacement of the leading end position of the probe needle 9A is represented by a curve which has an upper portion and a bottom portion reversed with respect to the example shown in FIG. 3. In case of cooling a wafer W, it is desirable that the displacement of the leading end of the probe needle 9A should be actually measured beforehand, and the relationship between an elapsed time and the leading end position of the probe needle should be stored in the external memory unit 23.

In the first embodiment, the time interval of the values of the leading end positions of the probe needle 9A stored in the external memory unit 23 and the time interval at which the controller 21 stands by in the step A1 in FIG. 4 matches with each other, but the invention is not limited to this case. For example, an interval of storing by the external memory unit 23 for each certain time may be set minutely, and a certain time at which the controller 21 stands by in the step A1 in FIG. 4 may be set roughly with respect to the minute time. In this case, the external memory unit 23 becomes likely to store the values of the leading end positions of the probe needle 9A corresponding to relatively large time intervals, and the controller 21 selects an arbitrary value from those values in the step A1 in FIG. 4.

According to such a case, it is possible to decide the stand-by time in the step A1 in FIG. 4 more flexibly. To be more precise, the length of the stand-by time can be changed in accordance with, for example, a change in a temperature rising speed or a temperature falling speed. In this case, when there is a further large temperature change, more adequate control can be enabled by shortening the stand-by time.

Note that according to the first embodiment, the number of the leading end positions of the probe needle 9A to be stored in the external memory unit 23 can be minimized, so that an effectiveness such that it is not necessary to increase the capacity of the external memory unit 23 without necessity can be obtained.

Second Embodiment

Next, the second embodiment of the invention will be explained with reference to FIG. 5 and FIG. 6. In the second embodiment, a temperature at a previous wafer inspection and an elapsed time from after the previous inspection is finished to a current time are utilized in preheating a probe needle in a wafer inspection step at a current time. These results in acquisition of an accurate and short preheat effect over plural times of inspections. Note that the structures of the wafer inspecting apparatus 1 and position control device 2 according to the second embodiment are the same as those in the first embodiment.

Figure 5:
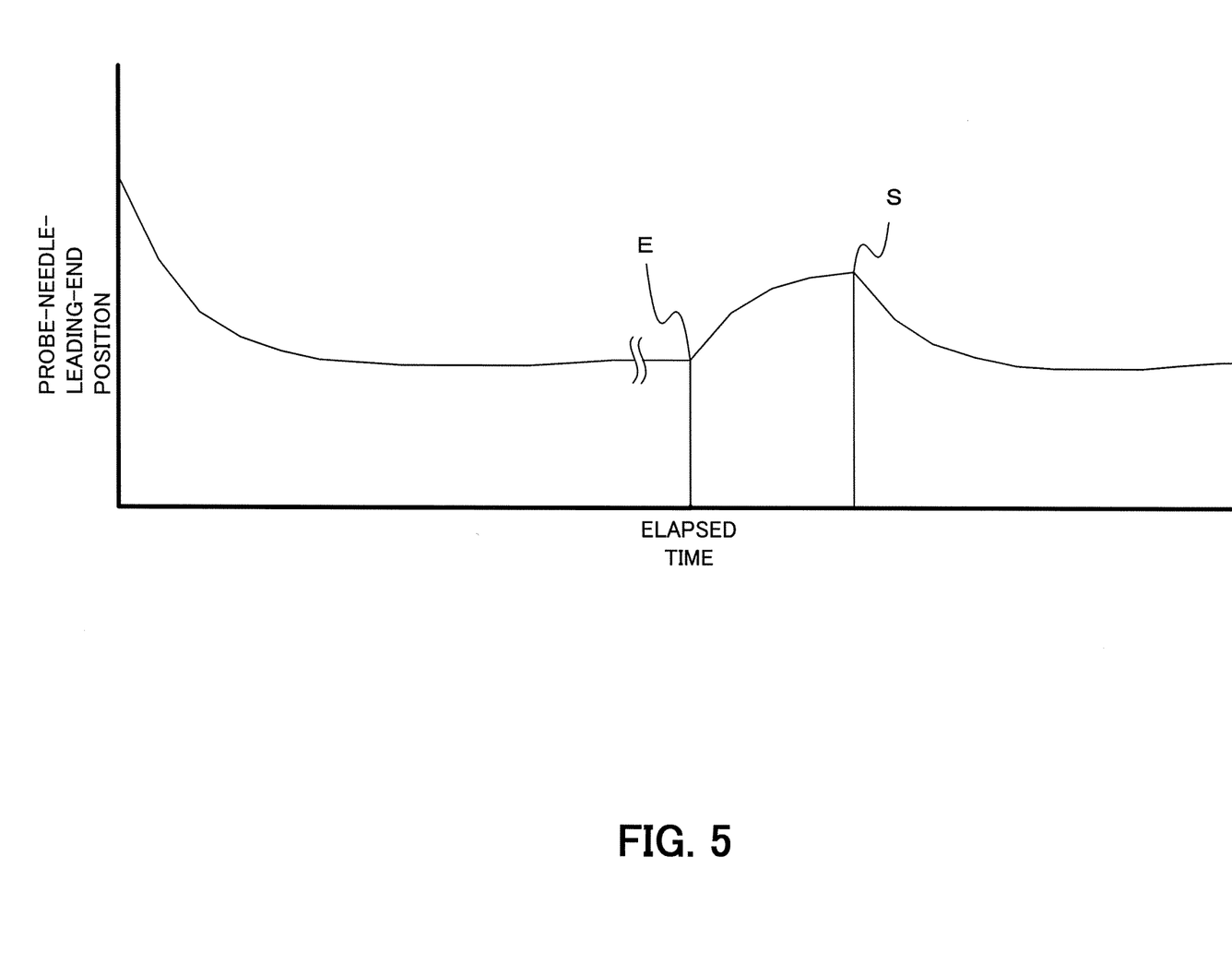
[FIG. 5] A diagram showing an example of the relationship between an elapsed time which includes an elapsed time after first wafer inspection is finished and the probe needle is separated away from a wafer, and when preheating for second inspection is performed and the displacement of the leading end position of a probe needle according to a second embodiment of the inventions.

FIG. 5 is a diagram showing an example of an elapsed time when preheating for a second time inspection is performed including an elapsed time from when a first time wafer inspection is finished and the probe needle 9A is caused to be separated away from a wafer W and the displacement of the leading end position of the probe needle. In FIG. 5, an elapsed time point represented by a symbol E is a point at which the first time inspection is finished and the probe needle 9A is moved away from the wafer W. An elapsed time point represented by a symbol S is a point at which once the probe needle 9A is moved away, and then caused to contact a wafer W again. For example, this represents a case where an inspection for a first wafer W is finished, the wafer W is replaced with a next wafer W, and then inspection is carried out.

In FIG. 5, a curve from the origin of the graph (a point when the probe needle 9A is caused to contact a wafer W at first) to the elapsed time point represented by the symbol E is the same as that in FIG. 3(b). However, a time at which inspection is carried out after the leading end position of the probe needle 9A is stabilized is indicated in a shortened manner. When the probe needle 9A is moved away from the wafer W at the elapsed time point represented by the symbol E, the probe needle 9A and the probe card 9 are naturally cooled down, so that the leading end position of the probe needle returns to the original position. When the probe needle 9A is caused to contact a wafer W before it is cooled down to an original temperature, the preheat time can be shortened. This is because that the probe needle 9A has residual heat. This is represented by a curve in the right of the figure from the elapsed time represented by the symbol S. The displacement of the leading end position of the probe needle 9A in second time preheating can be represented by a curve which starts from the middle of a curve representing the displacement of the leading end position of the probe needle 9A in first time preheating.

How the displacement of the leading end position of the probe needle 9A changes with respect to an elapsed time in a case where the probe needle 9A and the probe card 9 naturally dissipate heat can be known by actual measurement Actual measurement should be carried out for various wafer inspection temperatures. The leading end position of the probe needle 9A in a stage where inspection is about to be carried out can be estimated based on the actual measurement. Estimation can be made by comparing a temperature at a previous wafer inspection and an elapsed time from when the previous inspection is finished and the probe needle 9A is moved away from a wafer W to a current time with the foregoing actual measurement result.

In the second embodiment the result of the actual measurement, i.e., the relationship between a time progression and the displacement of the leading end position of the probe needle 9A in a case where the probe needle 9A and the probe card 9 naturally dissipate heat is stored in the external memory unit 23. Based on a temperature at a previous wafer inspection and an elapsed time from when the previous inspection is finished and the probe needle 9A is moved away from a wafer to a current time, it is estimated where current preheating starts from a point on a curve representing the displacement of the leading end position of the probe needle in previous preheating. Based on the estimation, the height of the main chuck 10 is controlled. As a result, the contact of the probe needle 9A with the wafer W is maintained appropriately, and the preheat time is shortened.

Figure 6:
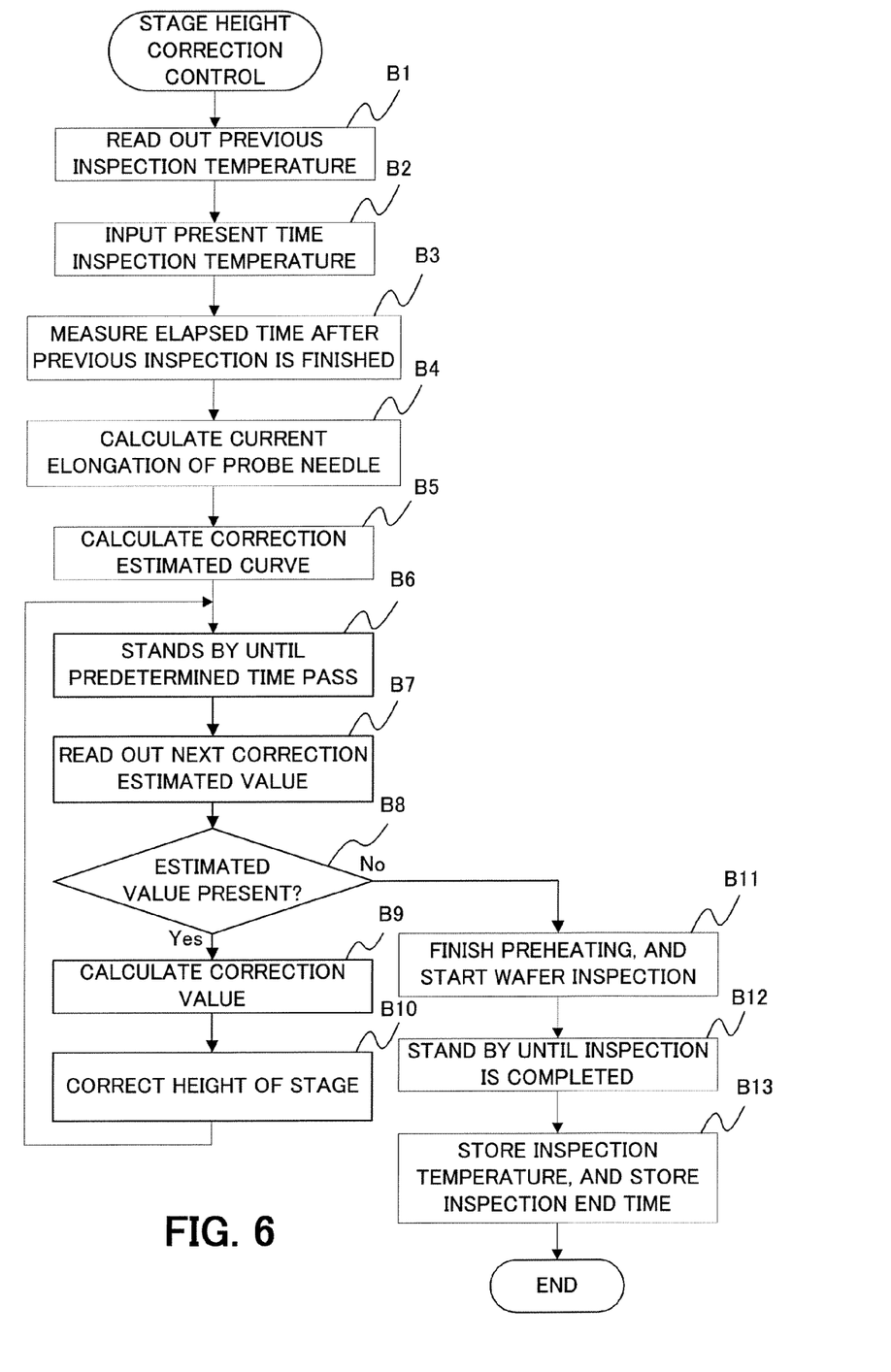
[FIG. 6] A flowchart showing an example of control operation of a stage for performing preheating in a wafer inspecting apparatus according to the second embodiment.

Next, the operation of the wafer inspecting apparatus 1 according to the second embodiment will be explained FIG. 6 is a flowchart showing an example of a control operation for the main chuck 10 (stage) for preheating the probe needle 9A and the probe card 9 in the wafer inspecting apparatus 1 according to the second embodiment. It is supposed that the following individual processes are completed before the flow goes to the process in FIG. 6. That is, the processes completed beforehand are (i) previous inspection, (ii) maintaining a temperature at a current inspection, and (iii) causing the probe needle 9A to contact a bonding pad on a wafer W. After those individual processes are completed, a preheat operation is started.

The controller 21 reads out a temperature at a previous inspection stored in the external memory unit 23 (step B1). Next, a current time inspection temperature input from the tester 5 or the input unit 24 is input (step B2). The controller 21 reads out a time when the previous inspection is finished and the probe needle 9A is moved away from a wafer W from the external memory unit 23, and reads out a current inspection start time from the clock unit 28, and measures an elapsed time from when the probe needle 9A is moved away from the wafer W to a current time based on the difference between the read-out times (step B3).

Subsequently, the controller 21 estimates the displacement of the leading end position of the probe needle at current based on the previous inspection temperature and the elapsed time after the previous inspection is finished (step B4). Next, the controller 21 calculates the relationship between an elapsed time in present preheating and the displacement of the leading end position of the probe needle 9A based on the relationship between the elapsed time after contact at the present inspection temperature and the leading end position of the probe needle 9A, and the estimated value of the current displacement of the leading end position of the probe needle 9A (step B5). For example, it is estimated which point the relationship between the elapsed time after contact at a present inspection temperature and the displacement of the leading end position of the probe needle 9A starts, and a subsequent relationship (sequence of the values of the displacements of the leading end positions of the probe needle 9A) is taken as the relationship between the elapsed time in present preheating and the displacement of the leading end position of the probe needle 9A.

Afterward, the flow from step B6 where the controller stands until a certain time passes to step B10 where the height of the stage is corrected is the same as that from the step A1 to the step A5 in the first embodiment.

When there becomes no correction estimated value for the relationship between the elapsed time in present preheating and the displacement of the leading end position of the probe needle 9A (step B8: No), the controller 21 notifies the tester 5 through the transmission reception unit 26 that the preheating is finished, and starts wafer inspection (step B1), and stands by until the inspection is completed (step B12). Absence of the correction estimated value means that the leading end position of the probe needle 9A is fully stabilized likewise the first embodiment.

When receiving a notification to the effect that the inspection is completed from the tester 5 through the transmission/reception unit 26, the controller 21 moves down the stage for a next operation, and writes a present inspection temperature and an inspection completed time (time when the probe needle 9A is moved away from a wafer W) in the external memory unit 23 (step B13). The present time inspection temperature and inspection completed time written in the external memory unit 23 are to be read out in the step B1 and the step B3 for preheat controlling in a next inspection.

Thus, in a case where next preheating is carried out before the probe needle 9A and the probe card 9 are not fully cooled (not have a surrounding temperature) after the previous inspection is finished, the contact of the probe needle 9A with a wafer W is appropriately maintained, and the preheat time can be shortened.

In the second embodiment although the explanation has been given of a case where the temperature at the previous inspection and the temperature at a present inspection are same in FIG. 5, the contact of the probe needle 9A with a wafer W can be appropriately maintained and the preheat time can be shortened by controlling the stage height as mentioned above in a case where the temperature at the previous inspection and the temperature at a present inspection differ. The case where the temperature at the previous inspection and the temperature at a present inspection differ is, for example, a case where a temperature is low at the previous time and is high at a present time, or a case where a temperature is high at the previous time and is low at a present time, or a case where there are two stages of low temperature and high temperature is possible.

In a case where the surrounding temperatures or the inspection temperatures of the wafer inspecting apparatus differ, the invention can be applied by appropriately correcting the relationship shown in FIG. 3 between an elapsed time after contact and the displacement of the leading end position of the probe needle 9A. In general, having different surrounding temperatures of the wafer inspecting apparatus is equivalent to moving the start point of the displacement curve of the leading end position of the probe needle 9A back and forth. Moreover, having different inspection temperatures is equivalent to moving the displacement curve of the leading end position of the probe needle up and down and moving the start point back and forth to match temperature differences.

The hardware structures and the flowcharts are just examples, and can be changed and modified arbitrarily.

The position control device 2 of the wafer inspecting apparatus 1 is not limited to an exclusive system, and can be realized using a general computer system. For example, a computer program for executing the foregoing operation stored in a computer-readable recording medium (a flexible disk, a CD-ROM, a DVD-ROM or the like) may be distributed, and the computer program may be installed in a computer to constitute a position control device 2 which executes the forgoing process. Further, the computer program may be stored in a memory device of a server device on a communication network like the Internet, and a general computer may download the program to constitute a wafer inspecting apparatus 1 of the invention.

In a case where an OS (operating system) and an application program work contributory or the OS and the application program work together to realize the foregoing individual functions, only the application program part may be stored in a recording medium or a memory device.

Further, the foregoing computer program may be superimposed on a carrier wave to distribute the program through a communication network.

The present application is based on Japanese Patent Application No. 2005-275150 filed on Sep. 22, 2005. The specification, claims and drawings of Japanese Patent Application No. 2005-275150 are entirely incorporated in this specification.

INDUSTRIAL APPLICABILITY

Because a short-time and appropriate preheating for a probe is realized with a simple device structure, a wafer inspection step becomes more efficient in semiconductor manufacturing industries.

The invention claimed is:

1. A wafer inspecting apparatus, comprising:
   a stage provided with a heater or a cooler thereinside, allowing a semiconductor wafer to be mounted on a top face thereof, and heating or cooling the semiconductor wafer to a predetermined temperature;
   a drive mechanism for driving said stage up and down;
   a probe card disposed upward said stage, and having a probe needle which comes in contact with a bonding pad formed on the semiconductor wafer to transmit a signal;
   a position control device for controlling said drive mechanism in a manner causing a bonding pad of the semiconductor wafer to contact said probe needle of said probe card; and
   a clock means for measuring an elapsed time after said probe needle is caused to contact the bonding pad,
   wherein said position control device controls a position of said stage by adding a position correction value based on the predetermined temperature and the elapsed time measured by said clock means after said probe needle is caused to contact the bonding pad, thereby causing the bonding pad of the semiconductor wafer to contact said probe needle of said probe card with a predetermined distortion amount.

2. The wafer inspecting apparatus according to claim 1, further comprising:
   a probe change memory means for storing a result of preliminary measurement of a relationship between an elapsed time after said probe needle is caused to contact a bonding pad of the semiconductor wafer mounted on said stage and heated or cooled to a predetermined temperature and an amount of expansion and contraction of said probe needle,
   wherein said position control device controls a position of said stage by adding a position correction value based on the predetermined temperature, the elapsed time measured by said clock means after said probe needle is caused to contact the bonding pad, and the relationship stored in said probe change memory means between the elapsed time and the expansion and contraction amount of said probe needle, thereby causing the bonding pad of the semiconductor wafer to contact said probe needle of said probe card with a predetermined distortion amount.

3. The wafer inspecting apparatus according to claim 2, wherein said probe change memory means stores individual elapsed time points at which an elapsed time after said probe needle is caused to contact the bonding pad is divided at predetermined intervals, and stores expansion and contraction amount of said probe needle associated with each elapsed time point, and
   wherein a length of the interval is defined in a manner causing expansion and contraction amounts of said probe needle at individual intervals to be greater than or equal to a resolution of the control of said drive mechanism by said position control device based on the result of preliminary measurement of the relationship between the elapsed time after said probe needle is caused to contact a bonding pad and an expansion and contraction amount of said probe needle.

4. The wafer inspecting apparatus according to claim 3, wherein the elapsed time after said probe needle is caused to contact a bonding pad is a finite time, and
   wherein a length of the interval at a beginning of the finite time is shorter than a length of the interval at an end of the finite time.

5. The wafer inspecting apparatus according to claim 4, wherein a length of the interval gradually becomes larger from a beginning to an end of the finite time.

6. The wafer inspecting apparatus according to claim 2, wherein said position control device corrects the relationship between the elapsed time stored in said probe change memory means and an expansion and contraction amount of said probe needle based on a temperature around said probe needle and the semiconductor wafer.

7. The wafer inspecting apparatus according to claim 1, further comprising:

temperature memory means for storing a temperature when the semiconductor wafer is subjected to inspection;

an after-separation clock means for measuring an elapsed time from after one inspection is finished and said probe needle is separated away from a bonding pad of the semiconductor wafer to a current time; and expansion-and-contraction-amount estimation means for estimating an expansion and contraction amount of said probe needle based on a temperature at a previous inspection stored in said temperature memory means, and the elapsed time measured by said after-separation clock means from after the previous inspection is finished and said probe needle is separated away from a bonding pad of the semiconductor wafer to a current time, wherein said position control device controls a position of said stage by adding a position correction value in a manner causing a bonding pad of the semiconductor wafer to contact said probe needle of said probe card with a predetermined distortion amount based on an expansion and contraction amount of said probe needle estimated by said expansion-and-contraction-amount estimation means, and wherein the predetermined temperature, and the elapsed time measured by said clock means after said probe needle is caused to contact the bonding pad.

8. A wafer inspecting method causing a probe needle for transmitting a signal to contact a bonding pad on a semiconductor wafer mounted on a stage to measure an electrical characteristic of a device formed on the semiconductor wafer, comprising:

a heating or cooling step of heating or cooling the semiconductor wafer to a predetermined temperature;

a clock step of measuring an elapsed time after the probe needle is caused to contact a bonding pad on the semiconductor wafer heated or cooled to the predetermined temperature; and a stage-position correction step of controlling a position of the stage by adding a position correction value based on the predetermined temperature and the elapsed time measured by said clock step, thereby causing the bonding pad to contact the probe needle with a predetermined distortion amount.

9. The wafer inspecting method according to claim 8, further comprising:

a probe-change actual measurement step of pre-measuring a relationship between an elapsed time after the probe needle is caused to contact the semiconductor wafer mounted on the stage and heated or cooled to a predetermined temperature and an amount of expansion and contraction of the probe needle, wherein in said stage-position correction step, the position of the stage is controlled by adding a position correction value based on the predetermined temperature, the elapsed time measured by said clock step, and the relationship between the elapsed time obtained in said probe-change actual measurement step and an expansion and contraction amount of the probe needle, thereby causing a bonding pad of the semiconductor wafer to contact the probe needle with a predetermined distortion amount.

10. The wafer inspecting method according to claim 9, wherein in said probe-change actual measurement step, individual elapsed time points at which an elapsed time after the probe needle is caused to contact the bonding pad is divided by predetermined intervals are measured, wherein an expansion and contraction amount of the probe needle corresponding to each elapsed time point is measured, and wherein a length of the interval is defined in a manner causing expansion and contraction amounts of said probe needle at individual intervals to be greater than or equal to a resolution of the control of said drive mechanism by said position control device based on a result of preliminary measurement of the relationship between the elapsed time after the probe needle is caused to contact a bonding pad and an expansion and contraction amount of the probe needle.

11. The wafer inspecting method according to claim 10, wherein the elapsed time after the probe needle is caused to contact a bonding pad is a finite time, and wherein a length of the interval at a beginning of the finite time is shorter than a length of the interval at an end of the finite time.

12. The wafer inspecting method according to claim 11, wherein a length of the interval gradually becomes larger from a beginning to an end of the finite time.

13. The wafer inspecting method according to claim 9, further comprising:

a correction step of correcting the relationship measured in said probe-change actual measurement step between the elapsed time and an expansion and contraction amount of the probe needle based on a temperature around the probe needle and the semiconductor wafer, prior to said stage-position correction step.

14. The wafer inspecting method according to claim 8, further comprising:

a temperature storing step of storing a temperature when a semiconductor wafer is subjected to inspection;

an after-separation clock step of measuring an elapsed time after one inspection is finished and the probe needle is separated away from a bonding pad of the semiconductor wafer to a current time; and an expansion-and-contraction-amount estimation step of estimating an expansion and contraction amount of the probe needle based on a temperature at a previous inspection stored in said temperature storing step, and an elapsed time measured in said after-separation clock step from after the previous inspection is finished and the probe needle is separated away from a bonding pad of the semiconductor wafer to a current time, wherein in said stage-position correction step, the position of the stage is controlled by adding a position correction value in a manner causing a bonding pad of the semiconductor wafer to contact said probe needle of a probe card with a predetermined distortion amount based on an expansion and contraction amount of the probe needle estimated in said expansion-and-contraction-amount estimation step, and wherein a predetermined temperature at which the semiconductor wafer is heated or cooled, and an elapsed time measured in said clock step after the probe needle is caused to contact the bonding pad.

15. A computer program product tangibly embodied in a computer-readable storage medium, the computer program product comprising instructions operable to cause a wafer inspecting apparatus to perform the following steps:

heating or cooling a semiconductor wafer to a predetermined temperature, the semiconductor wafer being mounted on a top face of a stage, the stage being provided with a heater or a cooler inside thereof;

driving the stage up and down with a drive mechanism;

disposing a probe card upward the stage, the probe card having a probe needle that contacts a bonding pad formed on the semiconductor wafer to transmit a signal;

controlling the drive mechanism in a manner causing a bonding pad of the semiconductor wafer to contact the probe needle of the probe card with a position control device; and measuring an elapsed time after the probe needle is caused to contact the bonding pad with a clock means, wherein the clock means executes a clock process of measuring an elapsed time after the probe needle is caused to contact the bonding pad, and wherein the position control device executes a stage position correction process for controlling a position of the stage by adding a position correction value based on the predetermined temperature and an elapsed time measured in the measuring step after the probe needle is caused to contact the bonding pad, thereby causing the bonding pad of the semiconductor wafer to contact said probe needle of said probe card with a predetermined distortion amount.

* * * * *